United States Patent [19]

Kase

[11] Patent Number: 4,922,493
[45] Date of Patent: May 1, 1990

[54] ERROR DETECTION AND CORRECTION CIRCUIT

[75] Inventor: Kiyoshi Kase, Chiba, Japan

[73] Assignee: Motorola, Inc., Schaumburg, Ill.

[21] Appl. No.: 232,191

[22] Filed: Aug. 15, 1988

[30] Foreign Application Priority Data

Sep. 10, 1987 [JP] Japan ................................ 62-225197

[51] Int. Cl.⁵ .......................................... G06F 11/00
[52] U.S. Cl. ........................................ 371/31; 371/6; 371/36
[58] Field of Search .............................. 371/6, 31, 36

[56] References Cited

U.S. PATENT DOCUMENTS

| | | | |
|---|---|---|---|
| 3,386,079 | 5/1968 | Wiggins | 371/6 |
| 3,568,147 | 3/1971 | Gilson | 371/31 |
| 3,688,039 | 8/1972 | Ishiguro | 371/31 |
| 3,697,776 | 10/1972 | Matejka | 371/36 |
| 4,224,689 | 9/1980 | Sundberg | 371/6 |
| 4,519,001 | 5/1985 | Morrison | 371/31 |
| 4,639,920 | 1/1987 | Kaneko | 371/31 |
| 4,686,676 | 8/1987 | McPherson | 371/36 |

*Primary Examiner*—Charles E. Atkinson
*Attorney, Agent, or Firm*—Jonathan P. Meyer

[57] ABSTRACT

An overload circuit detects input signals that are too high or too low in amplitude and generates a holding signal of a predetermined duration. The holding signal is applied to a data selector which normally passes the input signal to a shift register/majority gate but switches to supply the output of the majority gate to the shift register when a holding signal is present. Thus, the output is maintained constant during the predetermined durations when a holding singnal is present.

4 Claims, 5 Drawing Sheets

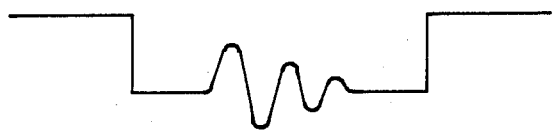
FIG. 4
FIG. 5
—PRIOR ART—
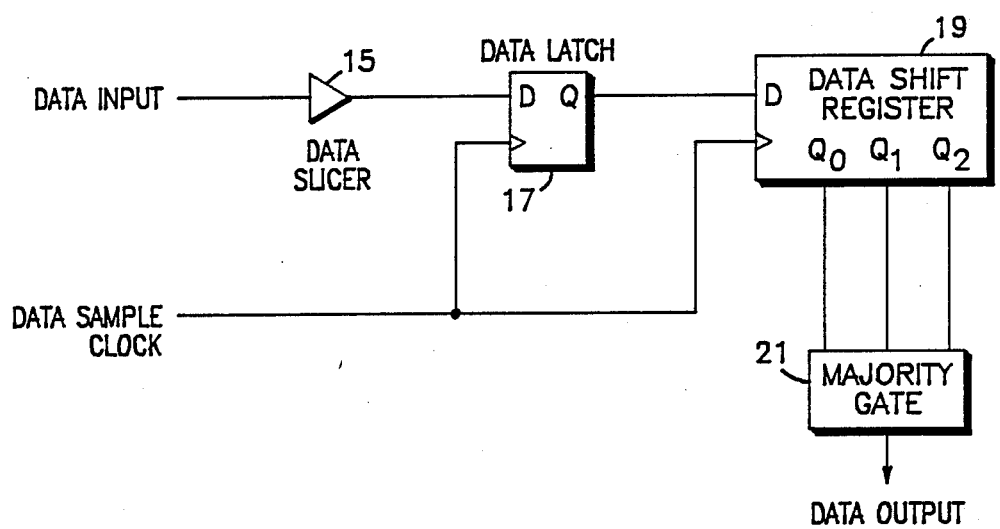

ERROR DETECTION AND CORRECTION CIRCUIT

FIELD OF THE INVENTION

The present invention relates to an error detection and correction circuit, for example, a circuit which corrects data errors generated by influences of peripheral noises in cases where an IC card is connected to a card reader/writer via a set of lead wires.

BACKGROUND OF THE INVENTION

FIG. 3(a) is a structure of a general IC card system. This system comprises a card reader/writer 1, a lead wire 3 such as a set of twisted paired lines, an IC card 7 connected to such lead wire 3 at the electrodes 5 provided at the end part of lead wire 3 and a controller 9 which controls respective operations of the system. The controller 9 is also connected with a motor 11 for inserting or extracting IC card 7 and a relay or solenoid 13.

In the system of FIG. 3(a), lead wire 3 connecting between card reader/writer 1 and IC card 7 is 1 meter long or longer and noises generated from motor 11 and relay or solenoid 13 which is included in the mechanism of the system appear on lead wire 3. Since lead wire 3 is equivalently formed by inductors and capacitors as shown in FIG. 3(b), it resonates at a certain frequency and this resonant frequency becomes considerably lower in cases where lead wire 3 is comparatively long. Accordingly, as shown in FIG. 3(c), the noise applied to lead wire 3 becomes a considerable wide-band interference signal which changes in a ringing mode both in positive and negative directions at the input part of IC card 7, namely at the input part of serial communication interface (SCI). This interference signal is superimposed, for example, as shown in FIG. 4, on the data signal which is transmitted, for example, to IC card 7 from card reader/writer 1 through lead wire 3 and, thereby, it is probable that data is errorneously read in IC card 7.

Therefore, the error correcting circuit as shown in FIG. 5 has been provided as the signal input part of IC card 7. The circuit of FIG. 5 is formed by a data slicer 15, a data latch 17, a data shift register 19 and a majority gate 21.

In the circuit of FIG. 5, the input data is sliced, as shown in FIG. 6, with reference to the predetermined threshold value at data slicer 15 and thereby a rectangular wave signal corresponding to the input data, namely the sliced data is obtained. This sliced data is fed to data latch 17 and is latched therein using the data sample clock having a frequency about 8 to 16 times the transmission frequency of the input data. An output Q of data latch 17 is fed to data shift register 19 and is sequentially shifted also by the data sample clock. Data shift register 19 is formed, for example, by three stages of shift registers. Outputs $Q_0$, $Q_1$, $Q_2$ of respective stages are fed to majority gate 21 and data generated corresponding to the majority rule of respective outputs is derived. As explained earlier, the error correcting circuit of the prior art has corrected data error to a certain degree by using the majority gate.

However, in case the high amplitude and wide-band noise elements N1 and N2 indicated in FIG. 6 are superimposed, for example, on the input data in the circuit of FIG. 5, the conventional error correcting circuit has a disadvantage that the output data error cannot be corrected sufficiently even though the data correction is made based on the majority rule.

SUMMARY OF THE INVENTION

It is therefore an object of the present invention, considering problems of the conventional circuit as explained above, to realize almost perfect detection and correction of data error and thereby improve reliability of data transmission in the IC card system even in case a high amplitude and wide duration noise element is superimposed on the data signal in the error detection and correction circuit.

In order to attain the aforementioned object, the error detection and correction circuit of the present invention comprises an overload detector which detects when an input signal level lies outside a predetermined range of change and provides an overload signal, an error correcting period setting part which provides an error correcting signal only for the duration of a specific period after the overload signal is supplied from the overload detector, a data memory which sequentially stores a specified amount of the input signal data, a majority gate which provides a logic signal determined by the majority rule from the specified amount of the data stored in the data memory, and a switch circuit which feeds an output on the majority gate to the data memory in place of the signal corresponding to the input signal while the error correcting signal is developed. The overload detector comprises a positive direction overload detecting circuit which detects when the input signal level goes outside the predetermined range in the positive direction, a negative direction overload detecting circuit which detects when the input signal level goes outside the predetermined range in the negative direction, and an OR gate which carries out the OR calculation of outputs of these detecting circuits. Moreover, the error correcting period setting part can be formed by a shift register to which the overload signal is fed and the data memory can also be formed by a specified number of stages of shift register.

In the above structure, the overload detector detects when the input signal level goes outside the predetermined range of change, for example, a data error may be generated due to noises, and outputs an overload signal. Once this overload signal is supplied, the error correcting period setting part provides an error correcting signal only for the duration of a specified error correcting period after the overload signal is supplied. When this error signal is provided, an output of the majority gate is used, in place of the input signal, as the signal to be fed to the data memory. Namely, the signal stored before generation of the error. As explained above, the input signal is prevented from being fed to the data memory and thereby developing erroneous data during the error correcting period.

BRIEF DESCRIPTION OF THE DRAWINGS

FIG. 4 illustrates a waveform of input data on which noise is superimposed;

FIG. 5 is a block diagram illustrating an error detecting and correcting circuit of the prior art.

DETAILED DESCRIPTION OF THE INVENTION

Figure 1:
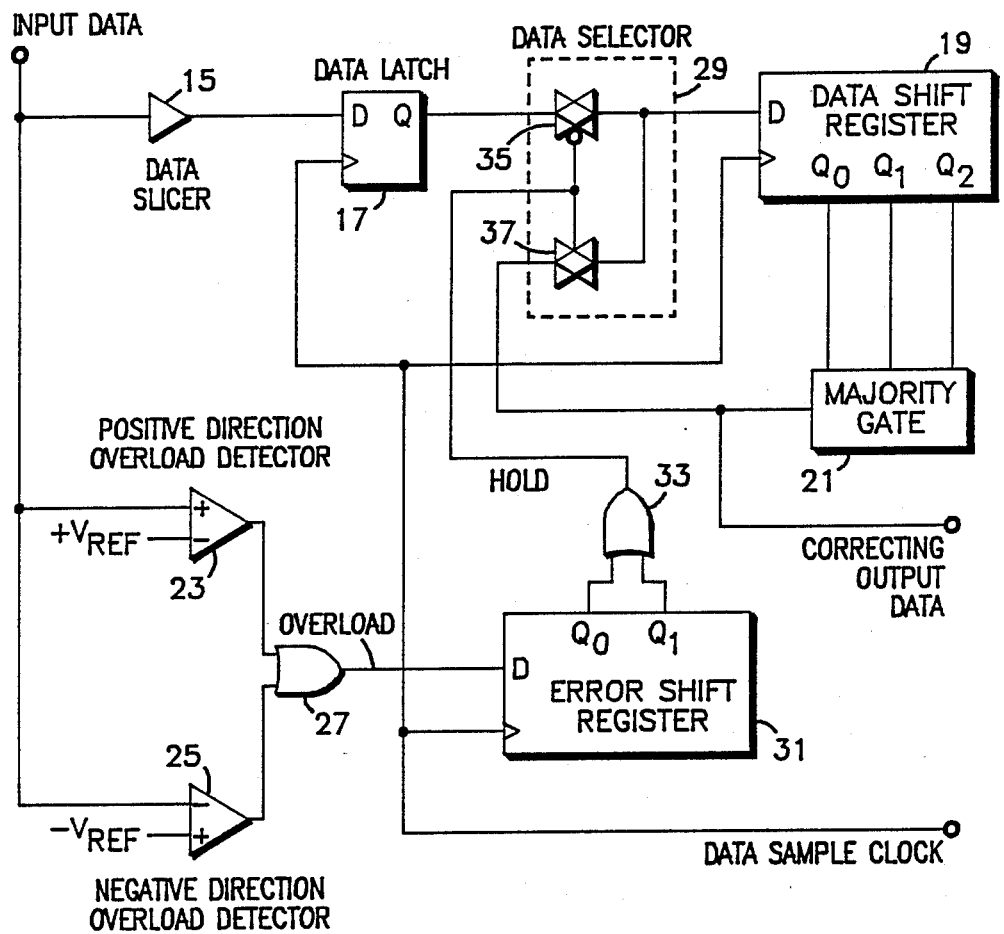
FIG. 1 is a block diagram indicating the structure of an error detecting and correcting circuit emboding the present invention.

A preferred embodiment of the present invention is explained with reference to the accompanying drawings. FIG. 1 illustrates a block diagram of an error detecting and correcting circuit embodying the present invention. This circuit comprises: a data slicer 15; a data latch 17; a data shift register 19; a majority gate 21, an overload detector which includes a positive direction overload detector 23, a negative direction overload detector 25 and an OR gate 27; a data selector 29; and an error shift register 31 and an OR gate 33 which form an error correcting period setting part. The positive direction overload detector 23 and negative direction overload detector 25 are respectively, in this embodiment formed by a comparator. The positive direction overload detector 23 can be realized by so providing a structure as to apply an input signal to the noninverting input terminal of the comparator and apply the reference voltage $+V_{REF}$ to the inverting input terminal thereof. The negative direction overload detector 25 can be realized by so providing the structure as to apply the input signal to the inverting input terminal of the comparator and apply the negative reference voltage $-V_{REF}$ to the noninverting input terminal thereof. The data selector 29 includes a transfer gate 35, inserted between the output of data latch 17 and the data input of data shift register 19, and a transfer gate 37, inserted between the output of majority gate 21 and the data input of data shift register 19. Gate 35 becomes conductive when an output of OR gate 33, namely the hold signal level, is low while gate 37 becomes conductive when the hold signal level is high.

Figure 2:
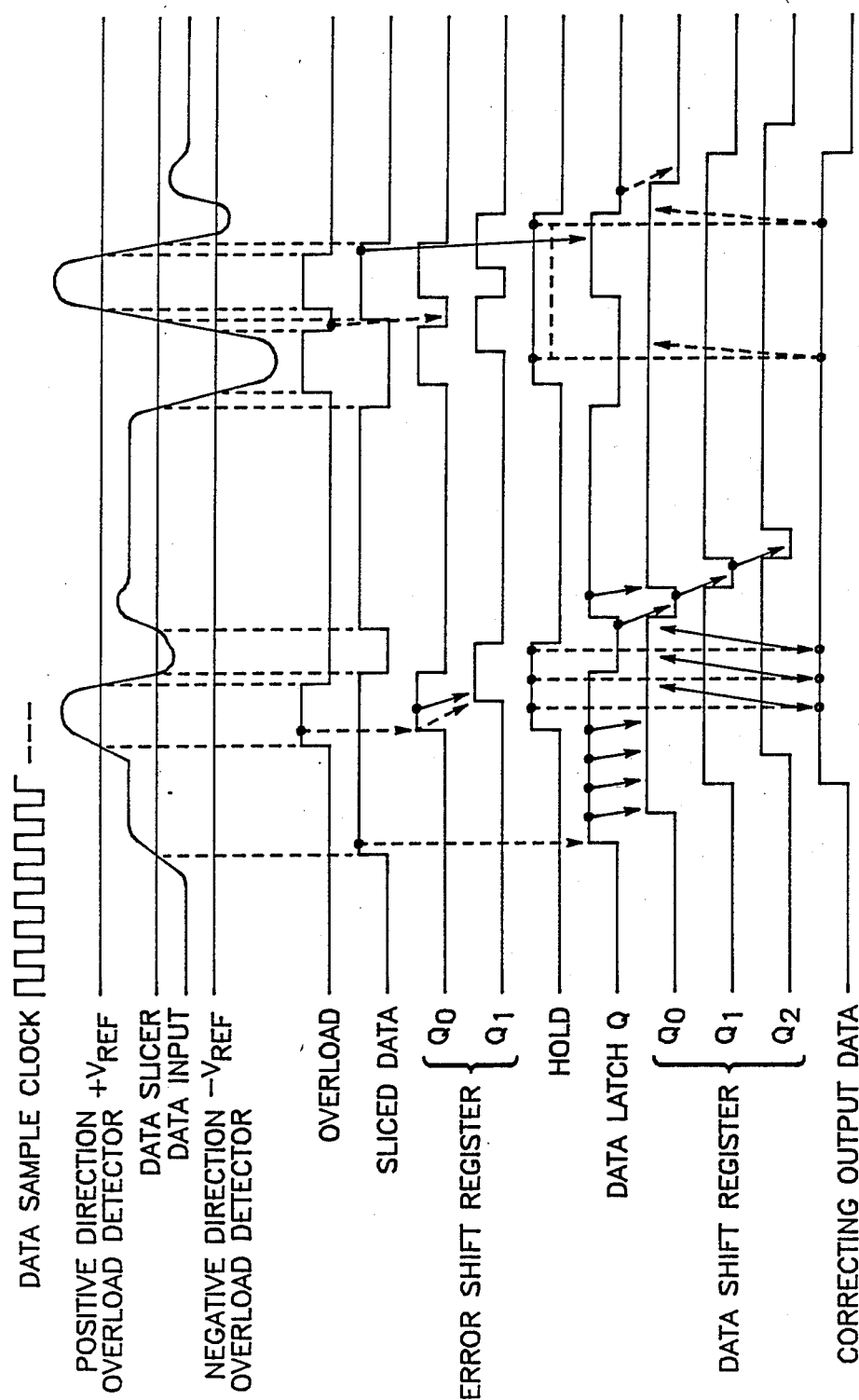
FIG. 2 illustrates waveforms for explaining operations of the circuit of FIG. 1.
Figure 3A:
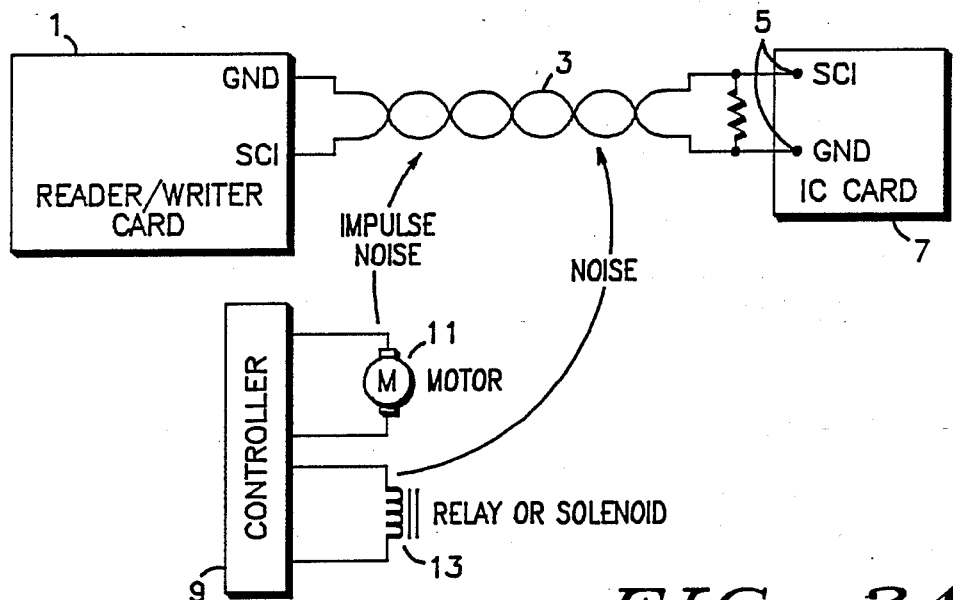
FIG. 3(a) is a simplified block diagram illustrating a structure of a general IC card system.
Figure 3B:
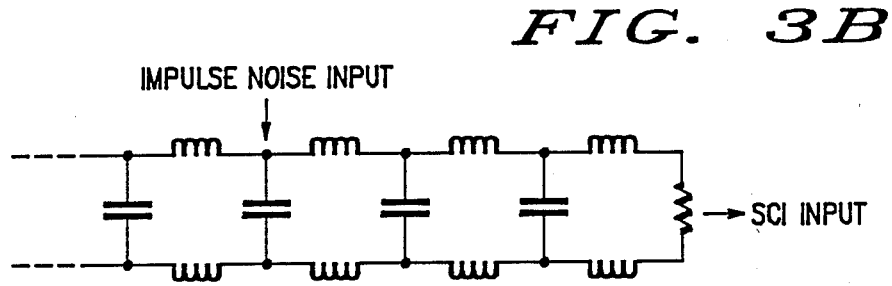
FIG. 3(b) is an electrical circuit illustrating an equivalent circuit of lead wire 3 in the apparatus of FIG. 3(a)
Figure 3C:
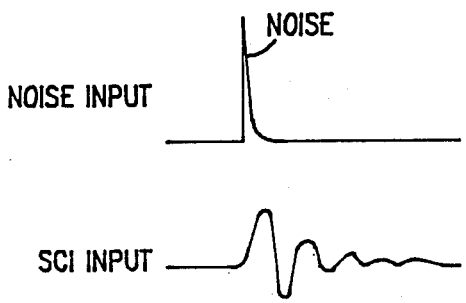
FIG. 3(c) illustrates waveforms for explaining the influence of a noise signal in the apparatus of FIG. 3(a)
Figure 6:
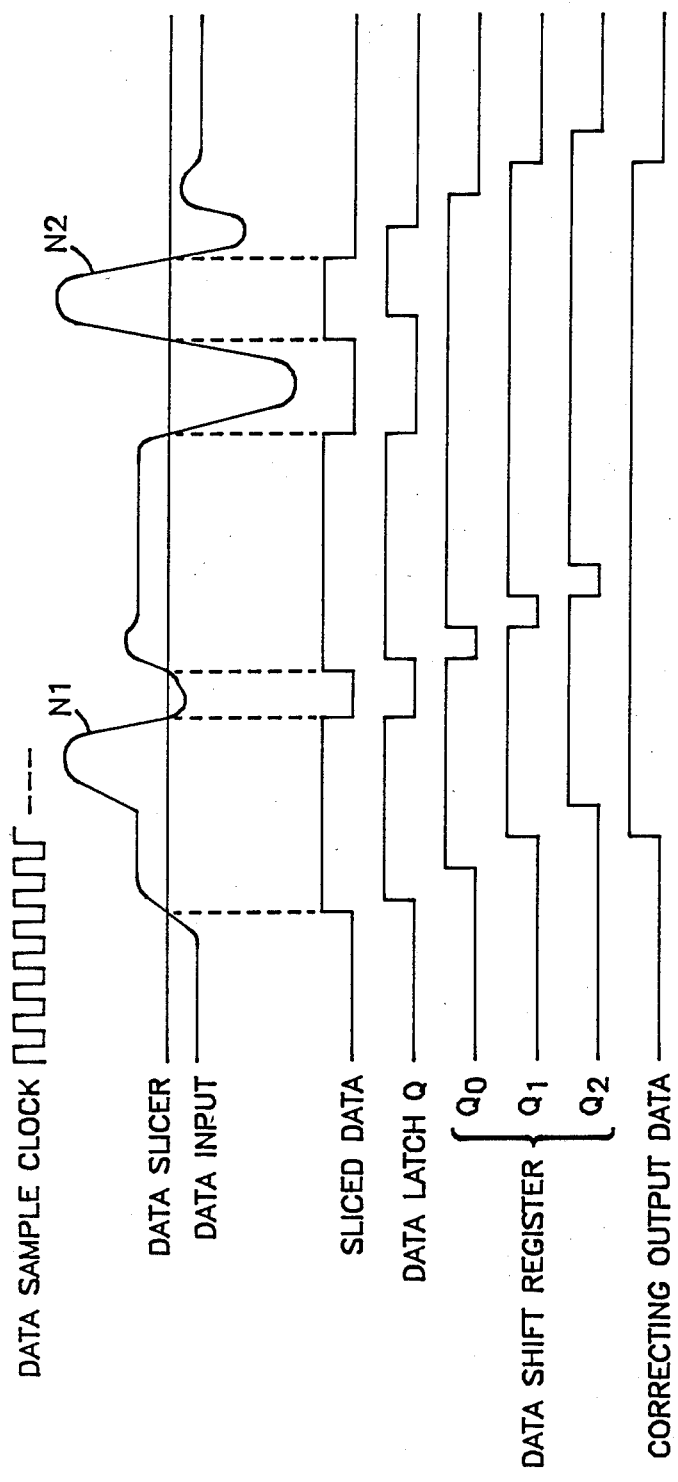
FIG. 6 illustrates waveforms for explaining operations of the circuit of FIG. 5.

Next, operations of the circuit of FIG. 1 are explained with reference to FIG. 2. Input data from the card reader/ writer is fed respectively to the input terminals of data slicer 15, positive direction overload detector 23 and negative direction overload detector 25. Data slicer 15 detects a level with reference to the specified threshold value level and provides, to the data input terminals of data latch 17, a high level signal as the sliced data when the input data level is higher than the specified threshold level or a low level signal when it is lower than the threshold level. Data latch 17 sequentially stores such sliced data based on the data sample clock and sequentially transmits the data which was stored in synchronization with the clock to data selector 29 as an output Q. A signal having a frequency 8 to 15 times the transmission frequency of input data is used as the data sample clock signal, for example.

Meanwhile, the input data is compared, for example, with positive reference voltage $+V_{REF}$ in the positive direction overload detector 23 to detect whether or not the input data signal level has exceeded reference voltage $+V_{REF}$. Moreover, the input data signal is compared with negative reference voltage $-V_{REF}$ in negative direction overload detector 25 to detect whether the input signal level becomes lower than the negative reference voltage $-V_{REF}$, namely whether or not a negative overload should be generated. The outputs of positive overload detector 23 and negative overload detector 25 are applied to OR gate 27 to generate the overload signal. As shown in FIG. 2, this overload signal becomes a high level when the input data signal generates an overload in the positive or negative direction. Next, this overload signal is applied to the data input terminal of error shift register 31 and is sequentially shifted to each stage of the shift register based on the data sample clock. Thereby, the signals which are sequentially shifted by the period of a data sample clock wave are supplied, as shown in FIG. 2, at the outputs $Q_0$ and $Q_1$ of each stage of the error shift register. These outputs $Q_0$ and $Q_1$ are fed to the OR gate 33 and, thereby, a hold signal having an extended duration is generated. The time duration of this hold signal changes depending on the number of stages of error shift register 31 and determines the error correcting period, to be explained later.

The hold signal thus generated is fed to data selector 29 to control transfer gates 35 and 37. That is, when the input data signal does not generate an overload and the hold signal level is therefore low, transfer gate 35 is conducting and output Q of data latch 17 is applied to the data input terminal of data shift register 19. Data shift register 19 sequentially fetches the data thus applied in synchronization with the data sample clock and shifts such data to each stage. Thereby, outputs $Q_0$, $Q_1$, $Q_2$ are obtained from each stage of data shift register 19. Each output is fed to majority gate 21. The data determined by the majority rule is developed as the correcting output data and is then supplied to the internal circuit of the IC card.

In this case, if an overload is generated in the input data due to the noise, the hold signal level becomes high and this high level condition continues for the error correcting period. When the hold signal level is high, transfer gate 37 of data selector 29 is conducting and transfer gate 35 is off. Accordingly, an output of majority gate 21 is supplied to the data input terminal of data shift register 19 in place of the output of data latch 17 and such outputs are sequentially fetched by the data shift register 19 in synchronization with the data sample clock. As explained earlier, when an overload condition is detected, one of the former sample data is discarded and a successive specified number of sample data are also neglected. Since the former sample data is in a transitional condition, error may be easily generated and the successive specified number of data may also generate data error due to the overload and resultant ringing. In this case, the duration of the error correcting period, which is determined by the number of stages of error shift register 31, is experimentally set because of the effect of the transmission rate of the input data, the length of lead wires connecting the IC card reader/-writer and IC card, and other variables. For example, in case a twisted pair line of one meter length is used with a transmissive rate of 9600 baud, almost perfect error correction is realized by using 3-bit data shift register 19 and 2-bit error shift register 31. The data sample clock, in this case, has a frequency capable of realizing a sampling rate of over 16 times for the input data.

In the above explanation, the error correcting period determined by error shift register 31 is fixed, but the fine error correction period can be forecast and error correction can also be realized, for example, by changing the error correction period in accordance with the overload level of the input signal. For example, the length of error shift register 31, namely the number of stages, can be changed dynamically based on a digital value of the overload level by detecting the overload level and converting such value of level into the digital value. In this case, if a large noise level is detected, the error correction period is so controlled as to become considerably longer.

As explained earlier, according to the present invention, generation of a data error can be accurately prevented by eliminating influences of external noise in circuit apparatus like the IC card system where inserting and extracting apparatus is provided far from a card reader/writer and these are connected through a comparatively long lead wire without using a line receiver, etc.

What is claimed is:

1. An error detection and correction circuit comprising an overload detector which detects when an input signal level goes beyond a predetermined range of change and develops an overload signal, an error correction period setting part connected to receive the overload signal and providing an error correction signal for a specified period after the overload signal is provided from the overload detector, a data memory which sequentially stores a predetermined amount of input signal data, a majority gate connected to said data memory for developing a majority signal determined by the majority rule of the predetermined amount of data stored in said data memory, and a switch circuit connected to said data memory, said correction period setting part, and said majority gate for providing an output of said majority gate in place of the signal corresponding to the input signal data to said data memory while the error correction signal exists.

2. An error detection and correction circuit according to claim 1, wherein the overload detector comprises a positive direction overload detecting circuit which detects when the input signal level goes beyond the predetermined range of change in the positive direction, a negative direction overload detecting circuit which detects when the input signal level goes beyond the predetermined range in the negative direction, and an OR gate which carries out the OR calculations of outputs of these positive and negative direction overload detecting circuits.

3. An error detection and correction circuit according to claim 1, wherein the error correction period setting part is formed by a predetermined number of stages of shift register to which the overload signal is fed.

4. An error detection and correction circuit according to claim 1, wherein the data memory is formed by a predetermined number of stages of shift register.

* * * * *

UNITED STATES PATENT AND TRADEMARK OFFICE
CERTIFICATE OF CORRECTION

PATENT NO. : 4,922,493

DATED : May 1, 1990

INVENTOR(S) : Kiyoshi Kase

It is certified that error appears in the above-identified patent and that said Letters Patent is hereby corrected as shown below:

On the title page please change "(73) Assignee: Motorola, Inc., Schaumburg, Ill." to --(73) Assignee: Nippon Motorola, Ltd., Tokyo, Japan--

Signed and Sealed this

Eighth Day of October, 1991

*Attest:*

HARRY F. MANBECK, JR.

*Attesting Officer*     *Commissioner of Patents and Trademarks*